US010128297B2

United States Patent
Drab et al.

(10) Patent No.: US 10,128,297 B2
(45) Date of Patent: Nov. 13, 2018

(54) PIN DIODE STRUCTURE HAVING SURFACE CHARGE SUPPRESSION

(71) Applicant: Raytheon Company, Waltham, MA (US)

(72) Inventors: John J. Drab, Santa Barbara, CA (US); Justin Gordon Adams Wehner, Goleta, CA (US); Christian M. Boemler, Lompoc, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/947,575

(22) Filed: Nov. 20, 2015

(65) Prior Publication Data
US 2016/0086998 A1    Mar. 24, 2016

Related U.S. Application Data

(62) Division of application No. 13/959,081, filed on Aug. 5, 2013, now Pat. No. 9,224,768.

(51) Int. Cl.
| | | |
|---|---|---|
| H01L 31/105 | (2006.01) | |
| H01L 27/146 | (2006.01) | |
| H01L 29/868 | (2006.01) | |
| H01L 27/144 | (2006.01) | |

(52) U.S. Cl.
CPC .... *H01L 27/14643* (2013.01); *H01L 27/1446* (2013.01); *H01L 27/14605* (2013.01); *H01L 27/14649* (2013.01); *H01L 27/14689* (2013.01); *H01L 29/868* (2013.01); *H01L 31/105* (2013.01)

(58) Field of Classification Search
None
See application file for complete search history.

(56) References Cited

U.S. PATENT DOCUMENTS

| | | |
|---|---|---|
| 9,224,768 B2 | 12/2015 | Drab et al. |
| 2004/0108516 A1 | 6/2004 | Kang |
| 2005/0017318 A1 | 1/2005 | Ishida et al. |
| 2007/0090418 A1 | 4/2007 | Fletcher et al. |

(Continued)

FOREIGN PATENT DOCUMENTS

| | | |
|---|---|---|
| JP | 2004-186699 | 7/2004 |
| JP | 2009-268083 | 11/2009 |
| WO | WO 2015/020805 A1 | 2/2015 |

OTHER PUBLICATIONS

Notification Concerning Transmittal of International Preliminary Report on Patentability (Chapter I of the Patent Cooperation Treaty), , PCT/US2014/047957, dated Feb. 18, 2016, 1 page.

(Continued)

*Primary Examiner* — Daniel Whalen
(74) *Attorney, Agent, or Firm* — Daly, Crowley, Mofford & Durkee, LLP

(57) ABSTRACT

A semiconductor structure having: a silicon structure; and a plurality of laterally spaced PiN diodes formed in the silicon structure; and a surface of the silicon structure configured to reduce reverse bias leakage current through the PiN diodes. In one embodiment, a gate electrode structures is disposed on a surface of the silicon structure, the gate electrode structure having portions disposed between adjacent pairs of the diodes, the gate structure being biased to prevent leakage current through the diodes.

18 Claims, 3 Drawing Sheets

(56) References Cited

U.S. PATENT DOCUMENTS

| | | | |
|---|---|---|---|
| 2007/0170436 A1* | 7/2007 | Sugawara | H01L 29/0615 257/77 |
| 2008/0308840 A1 | 12/2008 | Ogura | |
| 2009/0251582 A1 | 10/2009 | Oike | |
| 2012/0256304 A1 | 10/2012 | Kaigawa | |
| 2014/0070266 A1* | 3/2014 | Matsudai | H01L 29/7397 257/139 |

OTHER PUBLICATIONS

International Preliminary Report on Patentability, PCT/US2014/047957, dated Feb. 9, 2016, 4 pages.

Barry E. Burke, Stephanie A.Gajar, Dynamic Suppression of Interface-State Dark Current in Buried-Channel CCD's, IEEE, vol. 38, No. 2, Feb. 1991, pp. 285-290 (6 pages).

N.S. Saks, A Technique for Suppressing Dark Current Generated by Interface States in Buried Channel CCD Imagers, IEEE, vol. EDL-1 No. 7, Jul. 1980, pp. 131-133 (3 pages).

J. Hynecek, Virtual Phase CCD Technology, IEEE, 1979, pp. 611-614 (4 pages).

Albert K. Henning, Effects of Semiconductor Surface Band Pinning on Scanning Electrostatic Force Microscopy, Redwood Microsystems, Inc., Sep. 1, 1998, 12 pages.

Tetsuo Yamada, Haruo Okano, Nobudo Suzuki, The Evaluation of Buried-Channel Layer in BCCD's, IEEE, vol. ED-25, No. 5., May 1978. pp. 544-546 (3 pages).

Notification of Transmittal of the International Search Report and the Written Opinion of the International Searching Authority, or the Declaration, PCT/US2014/047957, dated Nov. 12, 2014, 1 page.

International Search Report, PCT/US2014/047957, dated Nov. 12, 2014, 3 pages.

Written Opinion of the International Searching Authority, PCT/US2014/047957, dated Nov. 12, 2014, 3 pages.

Notice of Allowance dated Sep. 8, 2015, U.S. Appl. No. 13/959,081, 8 pages.

* cited by examiner

PIN DIODE STRUCTURE HAVING SURFACE CHARGE SUPPRESSION

CROSS REFERENCE TO RELATED APPLICATION

This is a Divisional Application of application Ser. No. 13/959,081 filed Aug. 5, 2013 which application is hereby incorporated herein by reference in its entirety.

TECHNICAL FIELD

This disclosure relates generally to PiN diode structures and more particularly to PiN diode structures having surface charge suppression.

BACKGROUND

As is known in the art, a PiN diode includes an intrinsic semiconductor material, such as for example, silicon (Si) sandwiched between an n-doped region and a p-doped region. When the diode is reverse biased, the electric field fully depletes the intrinsic region. As a photodetector, the PiN diode is reverse biased. Under reverse bias, the diode ordinarily does not conduct (except for a small dark current or $I_s$ leakage). A photon entering the intrinsic region frees a carrier. The reverse bias field sweeps the carrier out of the region and creates a corresponding output current.

As is also known in the art, the noise performance of silicon PiN diode (Si:PiN) photodetectors is limited by the surface leakage or dark current. Exposure to various environmental conditions such as ionizing radiation or humidity can further degrade the performance by increasing the surface leakage current. Present devices are unfortunately designed in a manner that maximizes the surface generated dark current by biasing the surface in depletion. The contribution is partially mitigated by the use of a channel stop to remove the potential minima away from the surface and by annealing to passivate interface states, but the result is still a device where the surface dark current limits the ultimate performance.

In the current art, these devices are made from single crystal Silicon. The surface of the crystal is oxidized to produce a SiO2 passivation layer. In the interface between the Silicon and the SiO2, there are inherent defects due to the mismatch between the two materials. At these defect sites there are unbonded Si orbitals that are electrically active. A normal Silicon process attempts to passivate these dangling orbitals by annealing in Hydrogen, which bonds to the defect site and reduces its electrical activity. Such Hydrogen passivation is never completely effective, so some small percent of the precursor defect site remain electrically active where they contribute leakage current due to trapping/detrapping that occurs at the resulting recombination center.

SUMMARY

In accordance with the present disclosure a semiconductor structure is provided comprising: a silicon structure; and a plurality of laterally spaced diodes formed in the silicon structure; and a surface of the silicon structure configured to reduce reverse bias leakage current through the diodes.

In one embodiment, the surface has thereon a gate electrode structure biased to reduce reverse bias leakage current through the PiN diodes.

In one embodiment, a semiconductor structure is provided having: a silicon structure and a plurality of laterally spaced PiN diodes formed in the silicon structure. A surface of the silicon structure is configured to reduce leakage current through the diodes.

In one embodiment, the surface has thereon a gate electrode structures biased to reduce leakage current through the diodes.

In one embodiment, the PiN diodes operate in depletion.

In one embodiment, a semiconductor structure is provided having: a silicon structure; a plurality of laterally spaced PiN diodes formed in the silicon structure, each one of the diodes corresponding to one of an array of photon detector pixels; and a gate electrode structures disposed on a surface of the silicon structure, the gate electrode structure having portions disposed between adjacent pairs of the diodes, the gate structure being biased to prevent leakage current through the diodes.

In one embodiment, the PiN has a P+ region and an N+ region and the gate electrode structure has a plurality of apertures therein, each one of the apertures being disposed over a corresponding one of the P+ regions or N+ regions.

With such structure, a fully-depleted Si:PiN detector array is provided enabling integration of a surface pinned, fully-depleted PiN diode array with a conventional CMOS readout to provide a bulk-limited SCA (Sensor Chip Assembly) with very high Quantum Efficiency across the visible spectrum from 400-1000 nM. The structure suppresses surface generated dark current. More particularly, the structure fully suppresses reverse bias leakage current through the PiN diodes by Fermi band pinning the surface. As a result, the PiN diodes are limited by the bulk leakage current and have improved stability. The buried channel implant with channel stops separating pixels confines and store charge away from the surface and gate structures in the area between the diodes and the channel stop to control the surface potential. With application of an appropriate bias to the gate structures, the surface is pinned to the valence band and surface generated dark current is suppressed.

Thus, with such structure: The incorporation of a buried channel implant into a Si:PiN allows charge collection in the bulk of the material where it does not interact with the surface; The use of a gate structure allows the application of a bias which effectively pins the surface, fully suppressing surface generated dark current; The structure can be used as one of a plurality of like structures in a fully depleted Si:PiN detector array; and The structure enables integration of a surface pinned, fully depleted PiN diode array with a CMOS readout to provide a bulk-limited SCA with very high Quantum Efficiency.

The details of one or more embodiments of the disclosure are set forth in the accompanying drawings and the description below. Other features, objects, and advantages of the disclosure will be apparent from the description and drawings, and from the claims.

DETAILED DESCRIPTION

Figure 1:
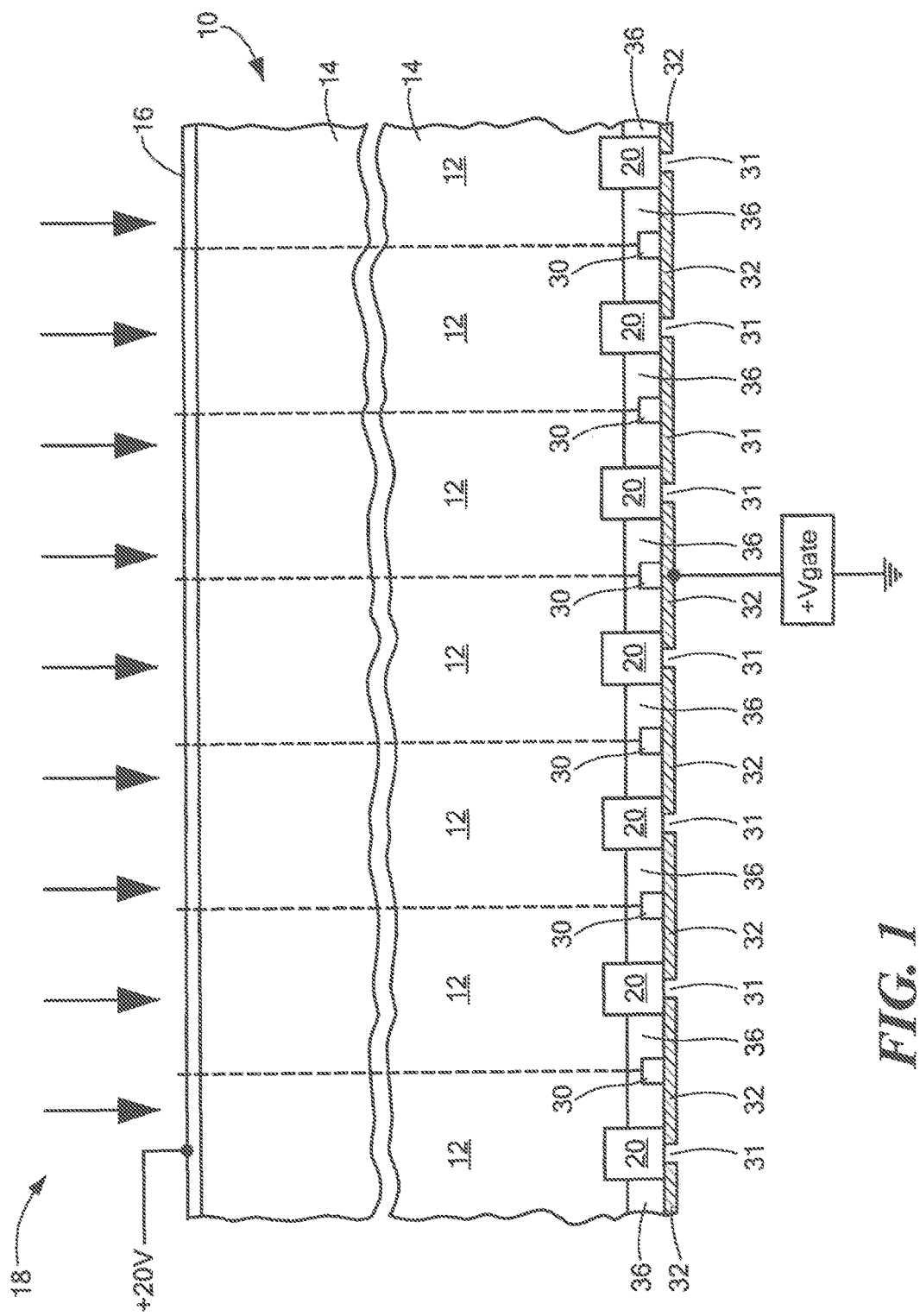
FIG. 1 is a diagrammatical, cross sectional sketch of a portion of array of photon PiN diode detectors according to the disclosure.

Referring now to FIG. 1, a portion of a semiconductor structure 10 having a plurality or array of photon detector, PiN diode pixels 12 to provide a focal plane array (FPA), is shown. The structure 10 includes an intrinsic silicon layer or body 14 having an ion implanted N+ type doped silicon layer 16 disposed in the upper surface of the intrinsic silicon layer 14. The upper surface is adapted to intercept incoming photons as indicated by arrows 18. The structure 10 includes a plurality of ion implanted P+ type doped silicon regions 20 dispersed in laterally spaced regions in an bottom, opposite, surface of the an intrinsic Silicon layer 14. The N+ type doped silicon region 16 and the plurality of P+ type doped silicon regions 20 forming, and being biased to form, a plurality of reverse biased PiN diodes 12, each one of the PiN diodes 12 corresponding to one of the photon detector pixels 12. More particularly, the N+ layer 16 is connected to a positive potential, here for example +20 volts, and the P+ regions 20 are connected to ground or a negative potential and the CMOS readout electronics senses the current into the negative terminal either by use of a charge sensitive amplifier or by connection to the gate of a simple source follower amplifier. Thus, each one of the pixels 12 is therefore a reverse biased PiN diode 12.

The structure 10 also includes a plurality of N type silicon lightly doped channel stop regions 30, each one being disposed around the periphery of a corresponding adjacent pair of the plurality of P+ type doped silicon regions 20 to thereby electrically isolated the pixels 12.

Figure 2:
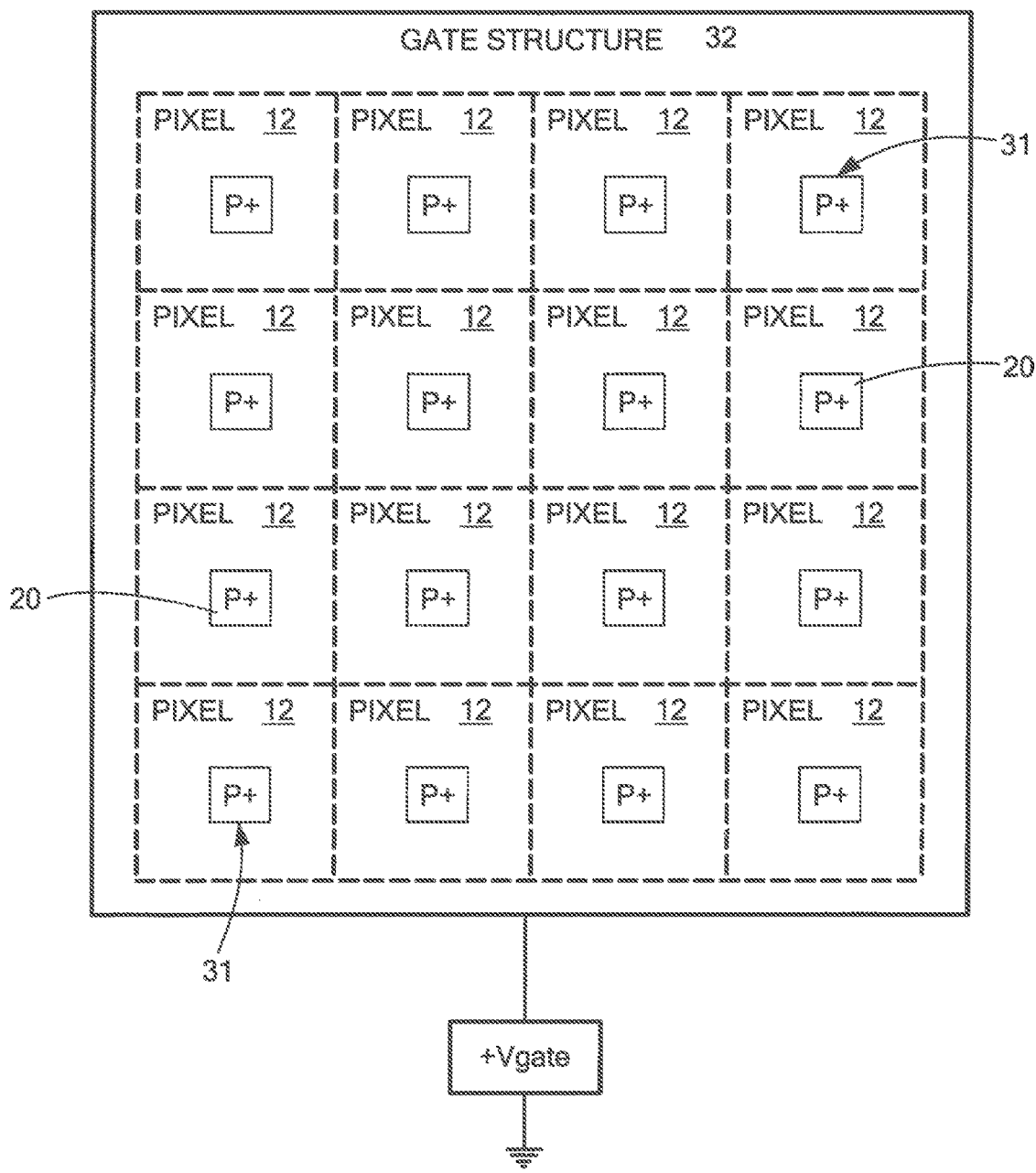
FIG. 2 is a plan view of a bottom surface of the of array of photon PiN diode detectors of FIG. 1 according to the disclosure.

The structure 10 also includes a gate electrode structure 32 disposed on said bottom surface, the gate electrode structures 32 having a plurality of apertures 31 (FIG. 2) therein, each one of the apertures 31 being disposed over a corresponding one of the P+ type doped silicon regions 20, as indicated. The gate structure 32 is formed by first growing a continuous silicon dioxide insulating layer, here for example, 500 Angstroms thick, over the bottom surface having the array of pixels, and then forming a continuous n type doped polycrystalline silicon layer on the 500 Angstrom thick insulating layer. The gate structure 32 is then masked and photolithographically processed to form aperture therein over the regions between where the P+ type doped regions 20 are to be formed. Next, P+ type dopant is ion implanted or diffused into the apertures to produce the P-doped regions 30 as shown. The gate electrode structures 32 is biased by a voltage $V_{gate}$ to control the surface potential in the area between the P+ implants, biasing the surface into either accumulation of depletion effectively pinning the surface and reducing reverse bias leakage current through the PiN diodes 12 (the leakage current between the N+ region and the P+ regions).

It is noted that the structure 10 includes a buried p-type channel 36 disposed, here ion implanted into, the bottom surface of the intrinsic silicon material 14. The bias $V_{gate}$ on the gate electrode structure 32 is selected to spatially bond channel 36 band carriers in valance bands thereof to conduction bands thereof.

Figure 3:
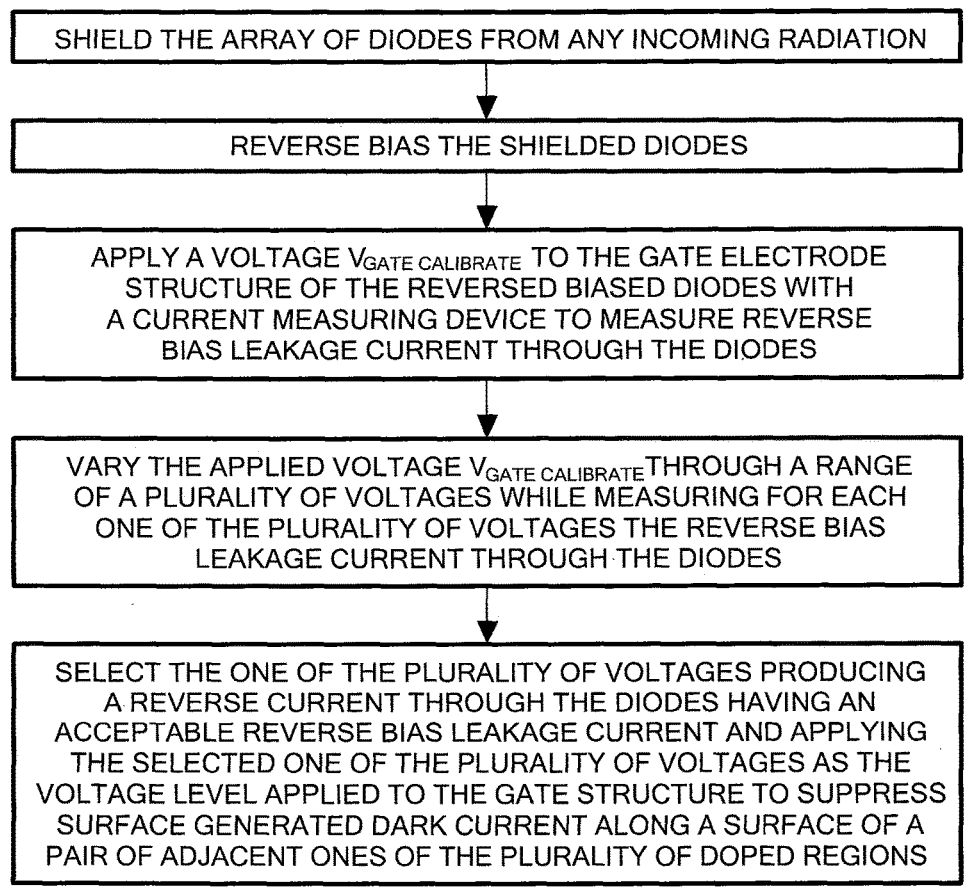
FIG. 3 is a flow diagram of steps used in the method of determining the bias voltage for the array of photon PiN diode detectors of FIG. 1 according to the disclosure.

A method for determining the bias voltage $V_{gate}$ to be applied to the gate electrode structure is, referring to FIG. 3, as follows: With the upper surface of the structure 10 shielded from any incoming radiation, and with the PiN diodes reverse biased, a voltage $V_{gate\ calibrate}$ is applied to the gate electrode structure 32 with a current measuring device, such as, for example a Charge Transfer Impedance Amplifier or electrometer coupled to the P+ regions 20 to measure reverse bias leakage current through the PiN diodes 12. The applied voltage $V_{gate\ calibrate}$ is stepped through a range of voltages, as for example from +10 volts to −10 volts and at each step in voltage, the current through the P+ regions is measured. The gate voltage $V_{gate}$ is selected as that one of the stepped voltages $V_{gate\ calibrate}$ where the current through the P+ regions is minimum. This minimum can occur if the diode is biased into accumulation or inversion. Accumulation occurs typically for negative voltages where the negative charge on the gate attracts holes from the substrate to the oxide-semiconductor interface. Inversion occurs at voltages beyond the threshold voltage. In inversion, there exists a negatively charged inversion layer at the oxide-semiconductor interface in addition to the depletion-layer. This inversion layer is due to the minority carriers that are attracted to the interface by the positive gate voltage. Here, the gate voltage $V_{gate}$ is selected when the surface is biased into inversion. The bias voltage $V_{gate}$ is a constant, time invariant voltage applied to all the gate electrode structures 32 and is selected to reduce reverse bias leakage charge through the diode 12.

A number of embodiments of the disclosure have been described. Nevertheless, it will be understood that various modifications may be made without departing from the spirit and scope of the disclosure. For example, the P and N regions may be reversed with a corresponding reversal in the voltage polarity applied to them. Further, the intrinsic material between the P+ and N+ regions may be removed. Still further the gate structure may be made from individual gate structures, each one being disposed over a corresponding one of the pixels. Accordingly, other embodiments are within the scope of the following claims.

What is claimed is:

1. A method for operating an array of photon detectors having a plurality of photon detector pixels, comprising:
   (A) providing a structure comprising:
      a layer having an N+ or P+ type doped conductivity adapted to intercept photons;
      a plurality of doped regions disposed in laterally spaced regions under the layer, such doped regions having a conductivity type opposite to the conductivity type of the layer, wherein the layer and the plurality of doped regions form a corresponding plurality of diodes, each one of the diodes corresponding to one of the plurality of photon detector pixels;
      a plurality of channel stop regions, each one of the channel stop regions having the same type conductivity as the conductivity type of the layer, each one of the channel stop regions being disposed between a pair of laterally spaced doped regions, each one of the channel stop regions have a doping concentration less than the doping concentration of the layer;
      a gate electrode having portions disposed on a pair of adjacent ones of the plurality of doped regions; and
   (B) applying a voltage supply on the gate electrode having a level to reduce leakage current through the pair of adjacent ones of the plurality of doped regions.

2. The method recited in claim 1 wherein the voltage has the level to spatially bond channel band carriers in valance bands of the channel stop regions to conduction bands of the channel stop regions.

3. A method for operating an array of photon detectors, comprising:
   (A) providing an array of diodes, comprising:
      a structure having a first conductivity type doped layer;
      a plurality of laterally spaced doped regions disposed under the first conductivity type doped layer, each one of the doped regions having a second conductivity type opposite the first conductivity type;
      wherein the plurality of doped regions and the first conductivity type doped layer form a plurality of diodes, each one of the plurality of diodes having a reverse bias leakage current;
(B) providing a gate structure over the plurality of doped regions;
(C) applying a voltage level to the gate structure to reduce said reverse bias leakage current.

4. The method recited in claim 3 wherein the voltage level biases the plurality of diodes into accumulation or inversion.

5. The method recited in claim 3 including determining the voltage level to reduce the leakage current and the applying comprises applying the determined voltage to the gate structure.

6. The method recited in claim 3 wherein the applying comprises applying a fixed voltage level to the gate structure.

7. A method for operating an array of photon detectors, comprising:
(A) providing a plurality of laterally spaced PiN diodes formed in a semiconductor structure, each one of the diodes corresponding to one of an array of photon detector pixels; each one of the diodes having a P+ or N+ conductivity type first doped region disposed under a layer having a conductivity type opposite the conductivity type of the first doped regions, the first doped regions terminating at a surface of the structure, each one of the diodes having a reverse bias leakage current;
(B) providing a gate electrode structure having a plurality of apertures therein, each one of the apertures being disposed under a corresponding one of the P+ or N+ regions; and
(C) providing a voltage to the gate electrode structure with a voltage level to reduce said reverse bias leakage current.

8. The method recited in claim 7 wherein the voltage level biases the diodes into accumulation or inversion.

9. The method recited in claim 7 including determining the voltage level to reduce the leakage current and the applying comprises applying the determined voltage to the gate electrode structure.

10. The method recited in claim 7 wherein the applying comprises applying a fixed voltage level to the gate electrode structure.

11. A method for operating an array of photon detectors, comprising:
(A) providing a semiconductor structure comprising:
(1) a semiconductor layer having an N+ or P+ type doped conductivity adapted to intercept photons;
(2) a plurality of doped regions disposed in laterally spaced regions under the layer, such doped regions having a conductivity type opposite to the conductivity type of the layer, wherein the layer and the plurality of doped regions form a corresponding plurality of diodes, each one of the diodes corresponding to one of a plurality of photon detector pixels, each one of the diodes having a leakage current;
(3) a plurality of channel stop regions, each one of the stop regions having the same type conductivity as the conductivity type of the layer, each one of the channel stop regions being disposed between a pair of laterally spaced doped regions, each one of the channel stop regions have a doping concentration less than the doping concentration of the layer;
(4) a gate electrode having portions disposed on a pair of adjacent ones of the plurality of doped regions;
(B) supplying the gate electrode with a voltage level to reduce the leakage current.

12. A method for operating an array of photon detectors having a plurality of photon detector pixels, comprising:
(A) providing a semiconductor structure, comprising:
(1) a layer having an N+ or P+ type doped conductivity adapted to intercept photons;
(2) a plurality of doped regions disposed in laterally spaced regions under the layer, such doped regions having a conductivity type opposite to the conductivity type of the layer, wherein the layer and the plurality of doped regions form a corresponding plurality of diodes, each one of the diodes corresponding to one of the plurality of photon detector pixels;
(3) a plurality of channel stop regions, each one of the channel stop regions having the same type conductivity as the conductivity type of the layer, each one of the channel stop regions being disposed between a pair of laterally spaced doped regions, each one of the channel stop regions have a doping concentration less than the doping concentration of the layer;
(4) a gate electrode having portions disposed on a pair of adjacent ones of the plurality of doped regions;
(B) applying a voltage on the gate electrode with a level selected to suppress surface generated dark current along a surface of pair of adjacent ones of the plurality of doped regions under the gate electrode compared with generated dark current absent such voltage.

13. A method for operating an array of photon detectors, comprising:
(A) providing an array of diodes, comprising:
a structure having a first conductivity type doped layer;
a plurality of laterally spaced doped regions disposed under the first conductivity type doped layer, each one of the doped regions having a second conductivity type opposite the first conductivity type;
wherein the plurality of doped regions and the first conductivity type doped layer form a plurality of diodes, each one of the diodes having a reverse bias leakage current;
(B) providing a gate structure over the plurality of doped regions;
(C) applying a voltage level to the gate structure to suppress the reverse bias leakage current along a surface of pair of adjacent ones of the plurality of doped regions under the gate electrode compared with the reverse bias leakage current absent such voltage.

14. The method recited in claim 13 including:
shielding the array of diodes from any incoming radiation;
reverse biasing the shielded array of diodes;
applying a voltage $V_{gate\ calibrate}$ to the gate electrode structure of the reverse biased shielded array of diodes with a current measuring device to measure the reverse bias leakage current through the shielded array of diodes;
varying the applied voltage $V_{gate\ calibrate}$ through a range of a plurality of voltages while measuring for each one of the plurality of voltages the reverse bias leakage current through the shielded array of diodes;
selecting the one of the plurality of voltages producing a reverse current through the array of diodes having an acceptable reverse bias leakage current and applying the selected one of the plurality of voltages as the voltage level applied to the gate structure to suppress surface generated dark current along a surface of a pair of adjacent ones of the plurality of doped regions.

15. The method recited in claim 14 wherein the selected one of the voltages is the one where the current through the array of diodes is minimum.

16. The method recited in claim 15 wherein the voltage level selected biases the array of diodes into accumulation or inversion.

17. The method recited in claim 14 wherein the selected one of the voltages is the one where the current through the shielded array of diodes is minimum.

18. The method recited in claim 13 wherein the voltage level biases the shielded array of diodes into accumulation or inversion.

* * * * *